United States Patent [19]
Kaiser

[11] Patent Number: 4,996,569
[45] Date of Patent: Feb. 26, 1991

[54] INTEGRATED CIRCUIT

[75] Inventor: Reinhold Kaiser, Heilbronn, Fed. Rep. of Germany

[73] Assignee: Telefunken electronic GmbH, Heilbronn, Fed. Rep. of Germany

[21] Appl. No.: 266,081

[22] Filed: Nov. 2, 1988

[30] Foreign Application Priority Data

Nov. 27, 1987 [DE] Fed. Rep. of Germany ....... 3740302

[51] Int. Cl.$^5$ ..................... H01L 29/92; H01L 27/04; H01L 27/02
[52] U.S. Cl. ........................ 357/14; 357/48; 357/51
[58] Field of Search .............................. 357/14, 51, 48

[56] References Cited

U.S. PATENT DOCUMENTS

| | | | |
|---|---|---|---|
| 3,584,266 | 5/1969 | Schilling | 357/14 |
| 3,639,814 | 1/1972 | Engbert | 357/48 |
| 3,962,718 | 6/1976 | Inoue et al. | 357/48 |

FOREIGN PATENT DOCUMENTS

| | | |
|---|---|---|
| 1764398 | 2/1971 | Fed. Rep. of Germany . |
| 2349986 | 5/1974 | Fed. Rep. of Germany . |
| 2829212 | 1/1980 | Fed. Rep. of Germany . |

OTHER PUBLICATIONS

IBM Technical Disclosure Bulletin, vol. 21, No. 3, Aug. 1978, "High Capacitance Device".

Primary Examiner—Rolf Hille
Assistant Examiner—Robert P. Limanek
Attorney, Agent, or Firm—Spencer & Frank

[57] ABSTRACT

In an integrated circuit array having a capacitance formed by a pn-junction and separated from other components by a pn-junction, semiconductor areas are provided which connect that zone of the two semiconductor zones forming the pn-junction of the capacitance that extends deeper into the semiconductor element than the other of the two semiconductor zones forming the pn-junction of the capacitance electrically to that zone of the two semiconductor zones forming the separating pn-junction that faces away from the capacitance.

12 Claims, 2 Drawing Sheets

INTEGRATED CIRCUIT

BACKGROUND OF THE INVENTION

The invention relates to an integrated circuit array having a capacitance formed by a pn-junction and separated from other components by a pn-junction.

It is known that integrated circuit arrays require capacitances. Such capacitances are achieved by, for example, pn-junctions. The capacitances must have a high quality so that they are suitable for a wide frequency range, for circuits with low operating currents, and for low-noise amplifiers, for example.

SUMMARY OF THE INVENTION

The object underlying the invention is to provide an integrated circuit array in which capacitances of high quality are provided. According to the invention, there are provided, in an integrated circuit array having a capacitance formed by a pn-junction and separated from other components by a pn-junction, semiconductor areas which connect that zone of the two semiconductor zones forming the pn-junction of the capacitance that extends deeper into the semiconductor element than the other of the two semiconductor zones forming the pn-junction of the capacitance electrically to that zone of the two semiconductor zones forming the separating pn-junction that faces away from the capacitance.

BRIEF DESCRIPTION OF THE DRAWINGS

The invention will now be described in greater detail, by way of examples, with reference to the drawings, in which.

DESCRIPTION OF THE PREFERRED EMBODIMENT

Figure 1:
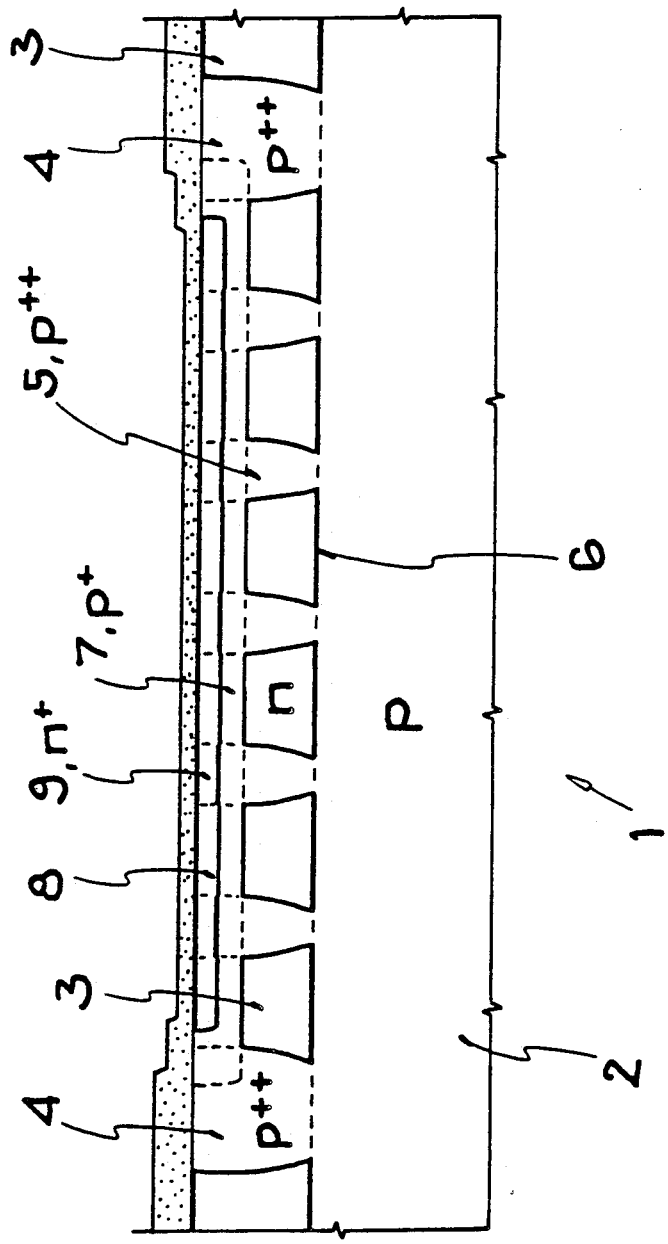
FIG. 1 shows an integrated circuit array in section.
Figure 2:
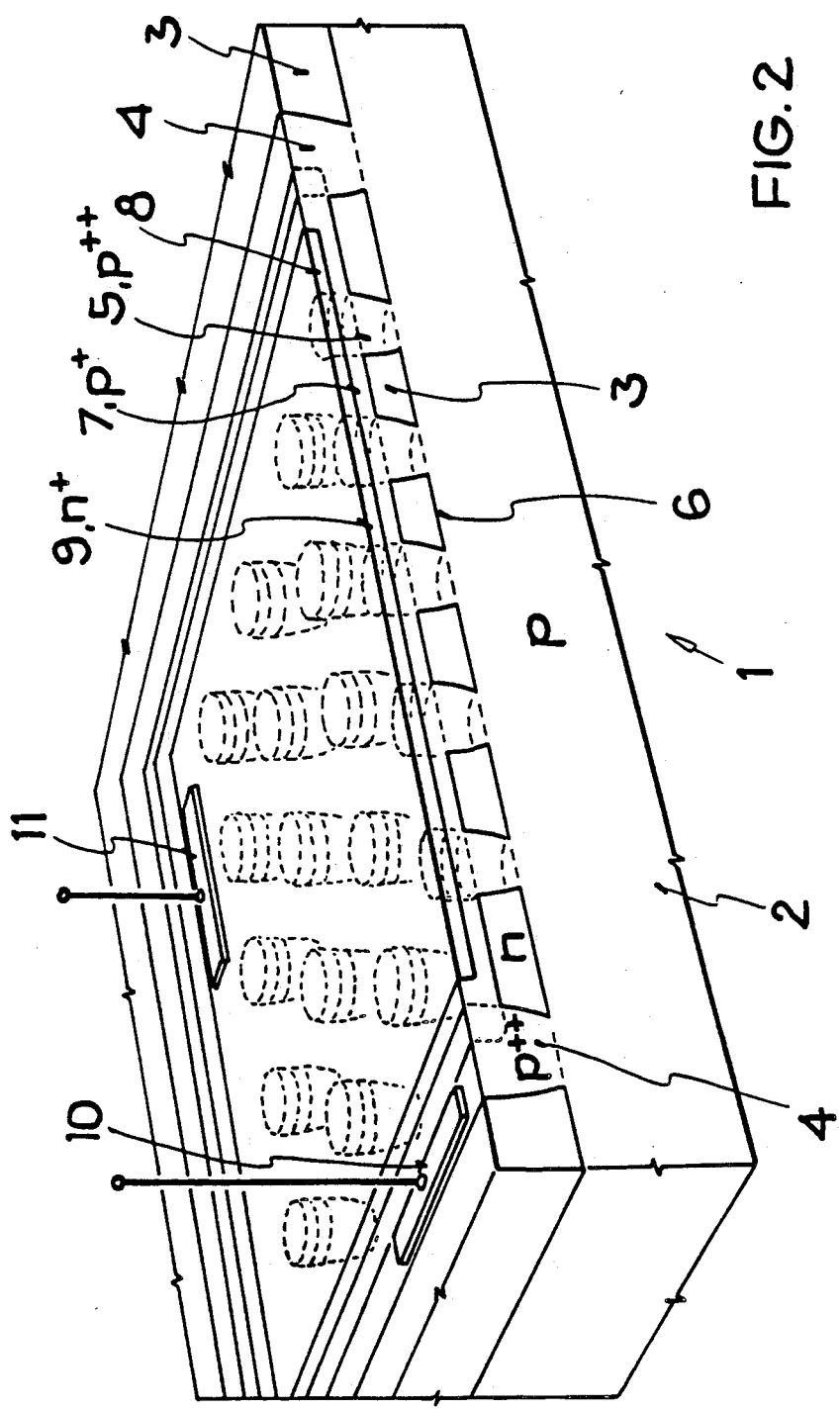
FIG. 2 shows an integrated circuit array in perspective.

FIGS. 1 and 2 show in section an integrated circuit array according to the invention, and FIG. 2 shows in addition an integrated circuit of this type in perspective. The semiconductor element 1 of the integrated circuit arrays in FIGS. 1 and 2 comprises a substrate 2 of the first conduction type and an epitaxial layer 3 of the second conduction type.

In the embodiment according to FIGS. 1 and 2 the substrate 2 is of the p-conduction type and the epitaxy layer 3 is of the n-conduction type. For separation of the capacitance, a separation zone 4 is inserted in the epitaxial layer 3 that surrounds the capacitance and is shaped like a frame. The separation zone 4 is of the p-conduction type in the embodiment and is made, for example, by diffusion.

Simultaneously with the manufacture of the separation zone 4, low-impedance areas 5 are inserted in the epitaxial layer in the same operation as the manufacture of the separation zone 4. If the manufacture of the low-impedance areas 5 of p-conduction type is simultaneous with the manufacture of the separation zone 4, a separate operation is not required, but the mask used to make the separation zone 4 is provided in addition with apertures for manufacture of the low-impedance areas 5. If the separation zone 4 is made by diffusion, the low-impedance areas 5 are also made by diffusion in the same operation.

The low-impedance areas 5 extend from the surface of the epitaxy layer to the separating pn-junction 6 formed by the epitaxy layer 3 and the substrate 2. The low-impedance areas have, for example, a circular or rectangular cross-section.

After manufacture of the separation zone 4 and of the low-impedance areas 5, a semiconductor zone 7 that is one of the two semiconductor zones forming the pn-junction 8 of the capacitance is inserted into the epitaxial layer 3. The semiconductor zone 7 is of the p-conduction type in the embodiment and therefore of the same conduction type as the substrate 2. In accordance with FIGS. 1 and 2, the semiconductor zone 9 is inserted in the semiconductor zone 7 and forms in conjunction with semiconductor zone 7 the pn-junction 8 of the capacitance. The semiconductor zones 7 and 9 are made by diffusion or by ion implantation, for example.

The low-impedance areas 5 connecting the semiconductor zone 7 electrically to the substrate 2 have a circular cross-section in the embodiment. Generally speaking however, a rectangular cross-section is preferred for design reasons. The low-impedance areas 5 are spread over the whole surface of the capacitance in accordance with the embodiment. When capacitance is mentioned here, the required capacitance is meant, and not parasitic capacitances which may still be present.

By the nature of the distribution of the low-impedance areas 5 over the surface of the capacitance and by the selection of the spacings between the low-impedance areas 5, the frequency dependency of the capacitance can be influenced. If low-impedance areas 5 are only present in a certain part of the capacitance surface, the capacitance is considerably more dependent on the frequency than if the low-impedance areas 5 are spread over the entire surface of the capacitance. The capacitance is also more dependent on frequency the greater the spacing between the low-impedance areas 5.

The low-impedance areas 5 have lower impedance in the area of the semiconductor zone 7 than that part of the semiconductor zone 7 not taken up by the low-impedance semiconductor areas 5. The low-impedance areas 5 have, for example, a sheet resistance of 20 Ohms/square unit whereas the semiconductor zone 7 underneath the semiconductor zone 9 (between the semiconductor zone 9 and the non-doped layer 3) has a sheet resistance of 5–10 kOhms/square unit.

The semiconductor zone 7 receives its potential from the substrate via the separation zone 4 or via the electrode 10 located on the surface of the semiconductor zone 7. The semiconductor zone 9 is contacted via the electrode 11.

What is claimed is:

1. An integrated circuit array having a capacitance formed by a first pn-junction and separated from other components by a further pn-junction comprising:

a substrate of one conductivity type; an epitaxial layer of the opposite conductivity type formed on a surface of said substrate; a first semiconductor zone of said one conductivity type formed in said epitaxial layer and extending from the surface of said epitaxial layer only partially through said epitaxial layer; a second semiconductor zone of said opposite conductivity type disposed in said first semiconductor zone at said surface of said epitaxial layer and forming said first pn-junction with said first semiconductor zone; and a plurality of areas of said one conductivity type extending from said first semiconductor zone through said epitaxial layer to said substrate and electrically connecting said first semiconductor zone to said substrate.

2. An integrated circuit array according to claim 1 further comprising a separation zone of said one conductivity type surrounding said first semiconductor zone at said surface of said epitaxial layer and extending through said epitaxial layer to said substrate.

3. An integrated circuit array according to claim 2 wherein said separation zone has a higher doping concentration than said first semiconductor zone.

4. An integrated circuit array according to claim 2 wherein said separation zone and said plurality of areas have substantially the same doping concentration.

5. An integrated circuit array according to claim 1 wherein said plurality of areas have a higher doping concentration than said substrate and than at least part of said semiconductor zone.

6. An integrated circuit array according to claim 1 wherein said first semiconductor zone has a higher doping concentration than said substrate.

7. An integrated circuit array according to claim 1, wherein said plurality of areas of making the electrical connection are spread over the entire surface of the capacitance.

8. An integrated circuit array according to claim 1, wherein the distribution of said areas making the electrical connection over the surface of the capacitance and/or the spacings between said areas making the electrical connection influences the frequency dependence of the capacitance.

9. An integrated circuit array according to claim 1, wherein said areas making the electrical connection are only provided on part of the capacitance surface.

10. An integrated circuit array according to claim 1, wherein said areas making the electrically conducting connection have lower impedance than said first semiconductor zone of the capacitance.

11. An integrated circuit array according to claim 7, wherein said first semiconductor zone overlaps said separation zone.

12. An integrated circuit array according to claim 9, wherein said first conductor zone receives its potential from said substrate via at least one of said separation zone and said areas making the electrically conducting connection.

* * * * *